US010320389B2

(12) United States Patent
Nebhrajani et al.

(10) Patent No.: US 10,320,389 B2
(45) Date of Patent: Jun. 11, 2019

(54) PROGRAMMABLE SHIFT REGISTER WITH PROGRAMMABLE LOAD LOCATION

(71) Applicant: Synopsys, Inc., Mountain View, CA (US)

(72) Inventors: Vijay A. Nebhrajani, Maharashtra (IN); Sanket Naik, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/876,693

(22) Filed: Jan. 22, 2018

(65) Prior Publication Data

US 2019/0131973 A1 May 2, 2019

(30) Foreign Application Priority Data

Nov. 2, 2017 (IN) .............................. 201741039137

(51) Int. Cl.
*H03K 19/177* (2006.01)
*G01R 31/3185* (2006.01)
*G11C 16/02* (2006.01)

(52) U.S. Cl.
CPC ............... *H03K 19/17712* (2013.01); *G01R 31/318516* (2013.01); *G11C 16/02* (2013.01); *H03K 19/1776* (2013.01); *H03K 19/17776* (2013.01)

(58) Field of Classification Search
CPC ......... H03K 19/17712; H03K 19/1776; H03K 19/17776; G01R 31/318516; G11C 16/02
USPC ........................................................... 326/40
See application file for complete search history.

(56) References Cited

U.S. PATENT DOCUMENTS 6,388,466 B1 * 5/2002 Wittig ................ H03K 19/1736
326/40
6,466,051 B1 * 10/2002 Jones ................. H03K 19/1737
326/39

* cited by examiner

*Primary Examiner* — Daniel D Chang
(74) *Attorney, Agent, or Firm* — Fenwick & West LLP

(57) ABSTRACT

Programmable shift register with programmable load location (pSRL) for data storage and method thereof is disclosed. A loadable programmable Shift Register (pSR) according to present disclosure receives a programmable input LL that defines where data D is to be loaded from the Load Register when L (Load Control Signal)=1. The loadable Shift Register with programmable load location (pSRL) is configured to obtain L (Load Control Signal), S (Shift Control Signal), LL (Load Location Control Signal), and p (programmable shift value), and wherein the pSRL is adapted to perform loading and shifting of data D based at least on the L, S, LL, and p values.

15 Claims, 13 Drawing Sheets

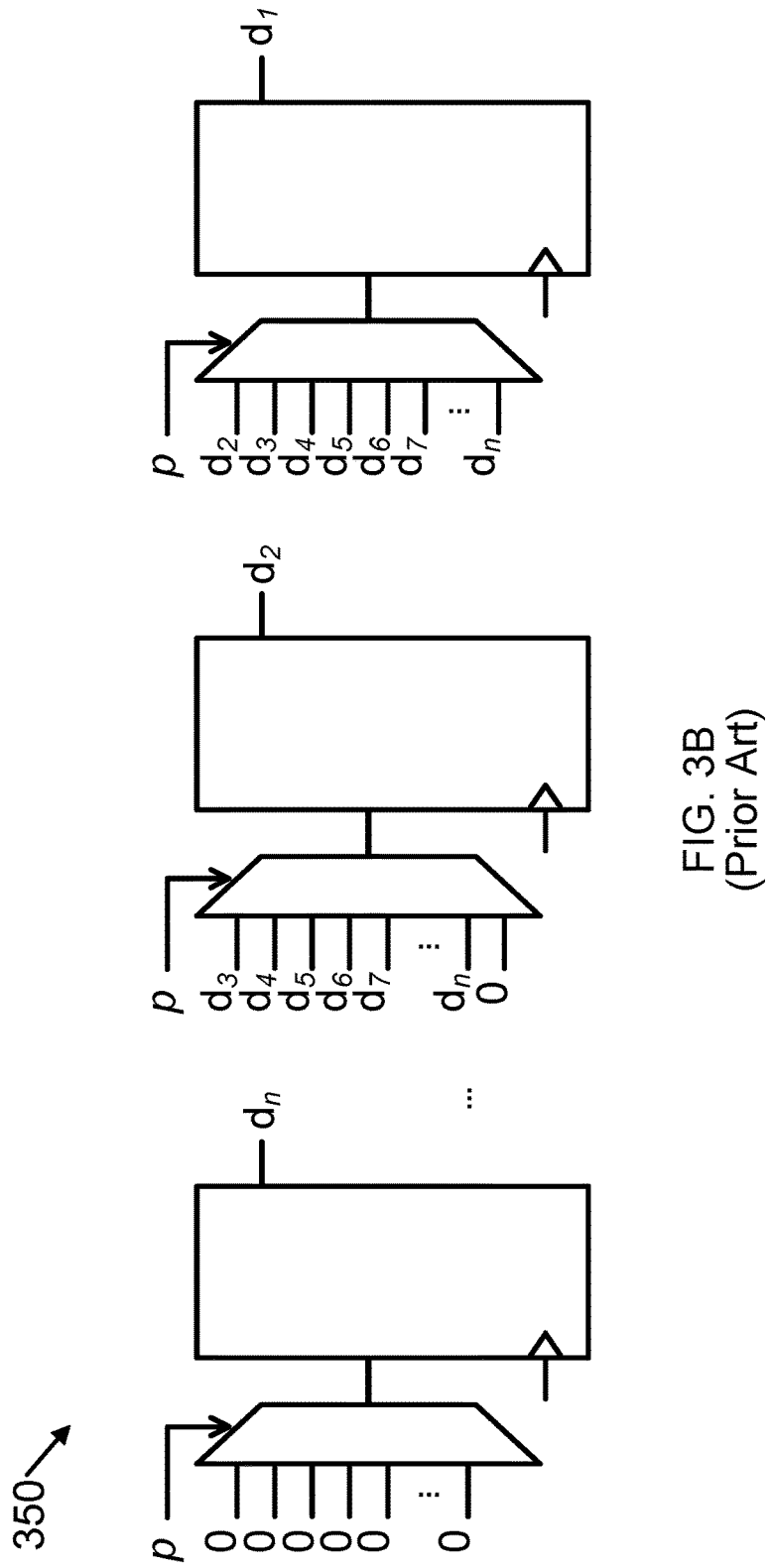

PROGRAMMABLE SHIFT REGISTER WITH PROGRAMMABLE LOAD LOCATION

FIELD OF THE INVENTION

The present disclosure relates generally to sequential logic circuit for storage or transfer of data in the form of binary numbers, and more particularly, the present disclosure relates to programmable shift register with programmable load location (pSRL) for data storage and methods of implementation thereof.

BACKGROUND

The background description includes information that may be useful in understanding present invention. It is not an admission that any of the information provided herein is prior art or relevant to the presently claimed invention, or that any publication specifically or implicitly referenced is prior art.

In digital circuit theory, sequential logic is a type of logic circuit whose output depends not only on the present value of its input signals but on the sequence of past inputs, the input history. This is in contrast to combinational logic, whose output is a function of only the present input. That is, sequential logic has state (memory) while combinational logic does not. As conventionally known, Shift Register (SR) is a type of sequential logic circuit that can be used for storage or transfer of data in the form of binary numbers. This sequential device loads data present on its inputs and then moves or "shifts" it to its output once every clock cycle, hence the name Shift Register. A shift register basically consists of several single bit "D-Type Data Storage elements", one for each data bit, either a logic "0" or a "1", connected together in a serial type daisy-chain arrangement so that the output from one data storage element becomes the input of the next storage element, and so on.

In digital circuits, a shift register is a cascade of flip flops, sharing the same clock, in which the output of each flip-flop is connected to the 'data' input of the next flip-flop in the chain, resulting in a circuit that shifts by one position the 'bit array' stored in it, 'shifting in' the data present at its input and 'shifting out' the last bit in the array, at each transition of the clock input. Data bits may be fed in or out of a shift register serially, that is one after the other from either the left or the right direction, or all together at the same time in a parallel configuration. The number of individual data storage elements required to make up a single Shift Register device is usually determined by the number of bits to be stored with the most common being 8-bits (one byte) wide constructed from eight individual data storage elements. Shift Registers are used for data storage or for the movement of data and are therefore commonly used inside calculators or computers to store data such as two binary numbers before they are added together, or to convert the data from either a serial to parallel or parallel to serial format. The individual data storage elements that make up a single shift register are all driven by a common clock signal making them synchronous devices.

The directional movement of the data through a shift register can be either to the left (left shifting) to the right (right shifting) left-in but right-out (rotation) or both left and right shifting within the same register thereby making it bidirectional. FIG. 1A illustrates an exemplary working 100 of shift register as available in the prior-art. The effect of data movement from left to right through a shift register can be presented graphically in FIG. 1A. Also, the directional movement of the data through a shift register can be either to the left (left shifting) to the right (right shifting) left-in but right-out (rotation) or both left and right shifting within the same register thereby making it bidirectional. However, because data must be retrieved one bit at time, it also takes N clocks to retrieve N bits of data stored in an N-bit SISO shift register. The 4-bit shift register requires 4 clocks to retrieve the 4 bits stored in it. Thus, the conventional SRs need to be made configurable and re-configurable such that they are more precise in data storage and transfer of the data and meet the requirement of real time dynamic nature of operations.

Conventionally known, programmable logic device (PLD) is an electronic component used to build reconfigurable digital circuits. The PLD is any IC that has programmable functions and programmable interconnections. PLD commonly includes one or more data paths, or collections of digital signals routed through the system during processing. The size of a collection, called the "data width" or "data path width" herein, depends on a number of factors. One factor in determining the data path width is the significance of the signals (i.e., the information that the signals represent, and the format of the signals). Another factor is the required speed of operation of the design. Yet another factor is the size constraints introduced by the design. Other factors may also possibly affect the data path width. In some cases, it may be desirable to modify the width of a data path at some point in the design, changing the extent to which data is propagated in parallel. This may be necessary, for example, because of different operating speeds in different portions of the design, or different constraints on the data width in different portions of the design. It may also be beneficial for this data width modification to be programmable and to be done dynamically. It would therefore be desirable to have a PLD capable of implementing a variable-width data path.

There is therefore a need in the art to provide a new, cost-effective, technically advanced and improved system, device and method that enables to not only efficiently reduce the number of flops but also to reduce the latency associated while reducing the number of flops. Further, there is also a need to provide improved system, device and method that includes storage capable of ensuring that all combinations of bits fits in the storage without any left over.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable.

The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

SUMMARY

The present disclosure relates generally to sequential logic circuit for storage or transfer of data in the form of binary numbers, and more particularly, the present disclosure relates to programmable shift register with programmable load location (pSRL) for data storage and method thereof.

In order to solve the technical problems as recited in the background above, the present disclosure provides a new, cost-effective, technically advanced and improved Programmable shift register with programmable load location (pSRL) that serves as a storage device for data streams. In an embodiment, the proposed pSRL enables to not only efficiently reduce the number of flops but also to reduce the latency associated while reducing the number of flops. Further, the proposed pSRL includes the storage capable of ensuring that all combinations of bits fits in the storage without any left over.

An aspect of the present disclosure relates to a loadable Shift Register with programmable load location (pSRL) configured to obtain L (Load Control Signal), S (Shift Control Signal), LL (Load Location Control Signal), and p (programmable shift value), and wherein the pSRL is adapted to perform loading and shifting of data D based at least on the L, S, LL, and p values.

In an aspect, the LL defines where data D is loaded. In another aspect, the shift control signal (S) controls shifting, when S=1, a p-bit right shift is performed.

In an aspect, the pSRL can include a bit-remapper function δ that receives L (Load Control Signal), S (Shift Control Signal), LL (Load Location Control Signal), and p (programmable shift value), and based on n (n+1):1 multiplexers and $p_i'$, outputs a load vector, wherein $p_i'=(LL-1)$ when ((L=1, S=0) and (LL≤i)), else if (S=1), $p_i'=p+i$, else $p_i'=i$.

In an aspect, the pSRL is at least "n" bits wide.

An aspect of the present disclosure relates to a loadable programmable Shift Register (pSR), said pSR being configured to receive a programmable input LL that defines where data D is to be loaded from the Load Register when L (Load Control Signal)=1.

In an aspect, the pSRL receives the L (Load Control Signal), the S (Shift Control Signal), the LL (Load Location Control Signal), and the p (programmable shift value) from any or combination of a control Finite State Machine (FSM), a programmable logic device (PLD), a software application, or any existing means of control.

In an aspect, if L=1 and S=0, $\delta_i=D_{i-LL}$ if LL≤i≤min (n, (LL+m)), else $\delta_i=d_i$. In another aspect, if L=0 and S=1, $\delta_i=d_{i+p}$ if i<(n−p), else $\delta_i=0$. In yet another aspect, if L=1 and S=1, $\delta_i=d_{i+p}$ if i<LL, else $\delta_i=D_{i-LL}$ if LL≤i≤min (n, (LL+m)), else $\delta_i=0$. In still another aspect, if L=0 and S=0, $\delta_i=d_i$.

An aspect of the present disclosure relates to method for storing data D in shift register. The method, by utilizing a bit-remapper function δ of a loadable Shift Register with programmable load location (pSRL), includes the steps of: obtaining L (Load Control Signal), S (Shift Control Signal), LL (Load Location Control Signal), and p (programmable shift value), and performing loading and shifting of data D based at least on the L, S, LL, and p values to store data D in said shift register.

Various objects, features, aspects and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure. The diagrams are for illustration only, which thus is not a limitation of the present disclosure, and wherein:

FIG. 3B illustrates an exemplary implementation of the exemplary programmable shift register as available in the prior-art.

DETAILED DESCRIPTION OF THE INVENTION

Figure 1A:
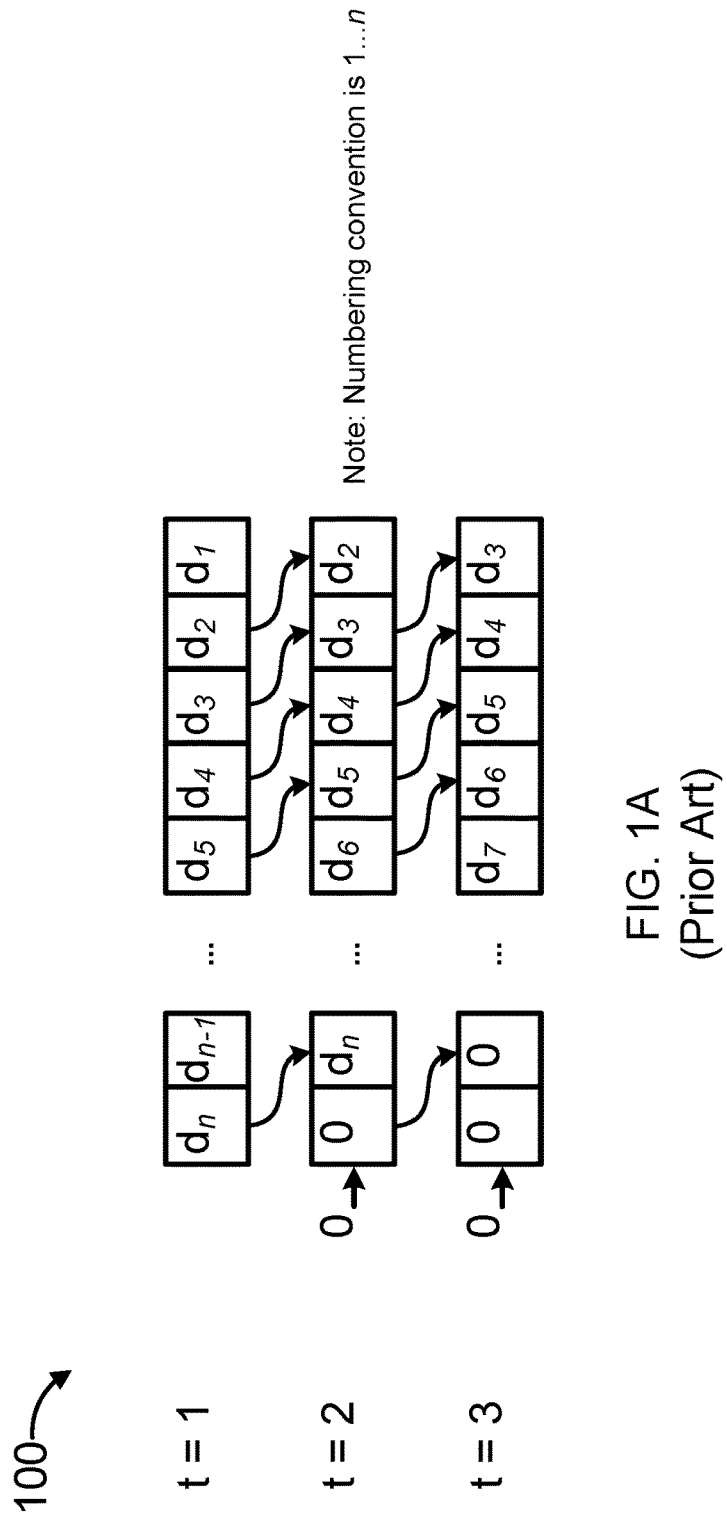
FIG. 1A illustrates an exemplary working of shift register as available in the prior-art.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

In the following description, numerous specific details are set forth in order to provide a thorough understanding of embodiments of the present invention. It will be apparent to one skilled in the art that embodiments of the present invention may be practiced without some of these specific details.

Embodiments of the present invention include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, and firmware and/or by human operators.

Embodiments of the present invention may be provided as a computer program product, which may include a machine-readable storage medium tangibly embodying thereon instructions, which may be used to program a computer (or other electronic devices) to perform a process. The machine-readable medium may include, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware).

Various methods described herein may be practiced by combining one or more machine-readable storage media containing the code according to the present invention with appropriate standard computer hardware to execute the code contained therein. An apparatus for practicing various embodiments of the present invention may involve one or more computers (or one or more processors within a single computer) and storage systems containing or having network access to computer program(s) coded in accordance with various methods described herein, and the method steps of the invention could be accomplished by modules, routines, subroutines, or subparts of a computer program product.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Exemplary embodiments will now be described more fully hereinafter with reference to the accompanying drawings, in which exemplary embodiments are shown. These exemplary embodiments are provided only for illustrative purposes and so that this disclosure will be thorough and complete and will fully convey the scope of the invention to those of ordinary skill in the art. The invention disclosed may, however, be embodied in many different forms and should not be construed as limited to the embodiments set forth herein. Various modifications will be readily apparent to persons skilled in the art. The general principles defined herein may be applied to other embodiments and applications without departing from the spirit and scope of the invention. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

Thus, for example, it will be appreciated by those of ordinary skill in the art that the diagrams, schematics, illustrations, and the like represent conceptual views or processes illustrating systems and methods embodying this invention. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named element.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

All methods described herein can be performed in any suitable order unless otherwise indicated herein or otherwise clearly contradicted by context. The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Various terms as used herein are shown below. To the extent a term used in a claim is not defined below, it should be given the broadest definition persons in the pertinent art have given that term as reflected in printed publications and issued patents at the time of filing.

The present disclosure relates generally to sequential logic circuit for storage or transfer of data in the form of binary numbers, and more particularly, the present disclosure relates to programmable shift register with programmable load location (pSRL) for data storage and method thereof.

In order to solve the technical problems as recited in the background above, the present disclosure provides a new, cost-effective, technically advanced and improved programmable shift register with programmable load location (pSRL) that serves as a storage device for data streams. In an embodiment, the proposed pSRL enables to not only efficiently reduce the number of flops but also to reduce the latency associated while reducing the number of flops. Further, the proposed pSRL includes the storage capable of ensuring that all combinations of bits fits in the storage without any left over.

An aspect of the present disclosure relates to a loadable Shift Register with programmable load location (pSRL) configured to obtain L (Load Control Signal), S (Shift Control Signal), LL (Load Location Control Signal), and p (programmable shift value), and wherein the pSRL is adapted to perform loading and shifting of data D based at least on the L, S, LL, and p values.

In an aspect, the pSRL is at least "n" bits wide.

In an aspect, the pSRL is any of a right shift register or a left shift register.

In an aspect, the LL defines where data D is loaded. In another aspect, the shift control signal (S) controls shifting, when S=1, a p-bit right shift is performed.

In an aspect, the pSRL can include a bit-remapper function $\delta$ that receives L (Load Control Signal), S (Shift Control Signal), LL (Load Location Control Signal), and p (programmable shift value), and based on n (n+1):1 multiplexers and $p_i'$, outputs a load vector, wherein $p_i'=(LL-1)$ when ((L=1, S=0) and (LL≤i)), else if (S=1), $p_i'=p+i$, else $p_i'=1$.

An aspect of the present disclosure relates to a loadable programmable Shift Register (pSR), said pSR being configured to receive a programmable input LL that defines where data D is to be loaded from the Load Register when L (Load Control Signal)=1.

In an aspect, the pSRL receives the L (Load Control Signal), the S (Shift Control Signal), the LL (Load Location Control Signal), and the p (programmable shift value) from a control Finite State Machine (FSM).

In an aspect, if L=1 and S=0, $\delta_i=D_{i-LL}$ if LL≤i≤min (n, (LL+m)), else $\delta_i=d_i$. In another aspect, if L=0 and S=1, $\delta_i=d_{i+p}$ if i<(n-p), else $\delta_i=0$. In yet another aspect, if L=1 and S=1, $\delta_i=d_{i+p}$ if i<LL, else $\delta_i=D_{i-LL}$ if LL≤i≤min (n, (LL+m)), else $\delta_i=0$. In still another aspect, if L=0 and S=0, $\delta_i=d_i$.

An aspect of the present disclosure relates to method for storing data D in shift register. The method, by utilizing a bit-remapper function $\delta$ of a loadable Shift Register with programmable load location (pSRL), includes the steps of: obtaining L (Load Control Signal), S (Shift Control Signal), LL (Load Location Control Signal), and p (programmable shift value), and performing loading and shifting of data D based at least on the L, S, LL, and p values to store data D in said shift register.

Figure 1B:
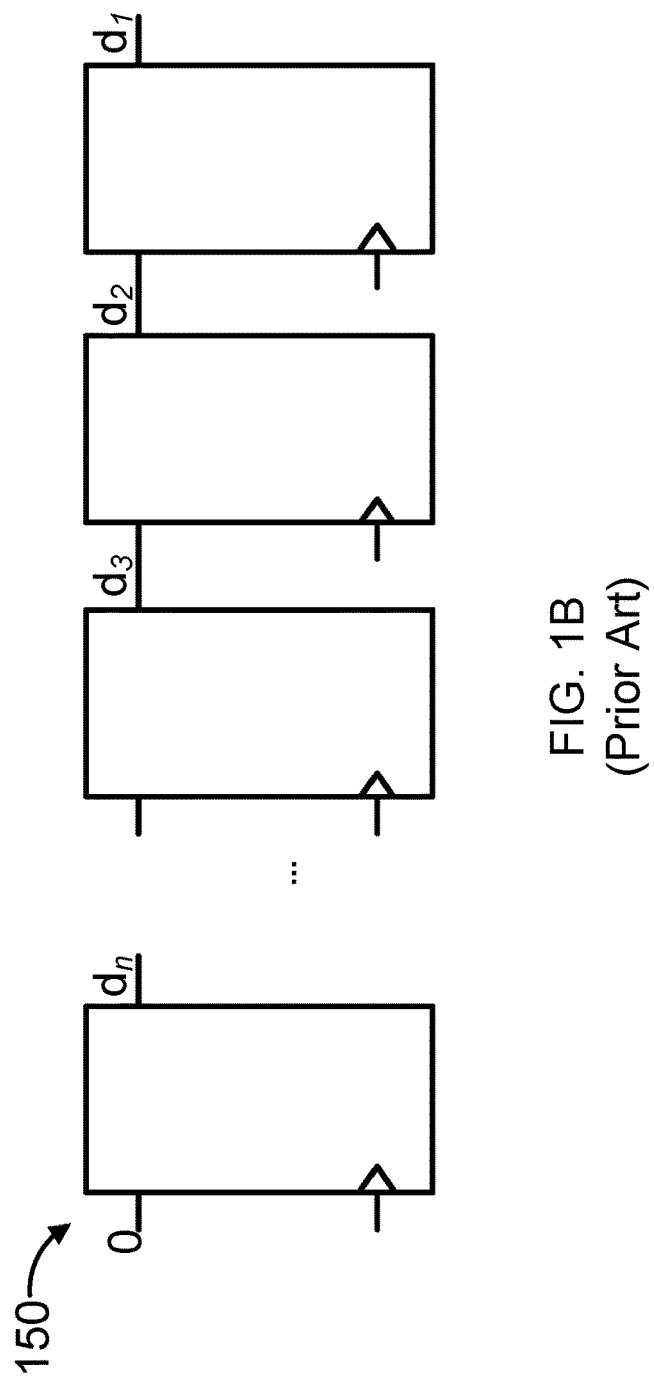
FIG. 1B illustrates an exemplary implementation of the exemplary shift register as available in the prior-art.

In digital circuits, a shift register is a cascade of flip flops, sharing the same clock, in which the output of each flip-flop is connected to the 'data' input of the next flip-flop in the chain, resulting in a circuit that shifts by one position the 'bit array' stored in it, 'shifting in' the data present at its input and 'shifting out' the last bit in the array, at each transition of the clock input. More generally, a shift register may be multidimensional, such that it's 'data in' and stage outputs are themselves bit arrays: this is implemented simply by running several shift registers of the same bit-length in parallel. FIG. 1A illustrates an exemplary working 100 of shift register as available in the prior-art. Even though FIG. 1A illustrates an example of simple n-bit right shift register (SR), both left and right shift registers are possible. As shown in FIG. 1A data ($d_n, d_{n-1} \ldots d_1$) shifts right by one bit every clock (t) (or at every successive time instant). FIG. 1B illustrates an exemplary implementation 150 of the exemplary shift register (SR) as available in the prior-art. As shown in FIG. 1B, the SR is a chain of flip flops wherein an output of each is connected to the input of another. The input of the $n^{th}$ flop is 0. As recited in FIG. 1A and as implemented in FIG. 1B with every clock cycle, the data "shifts" to right flip flop. However, it may be appreciated from the above implementation that in such circuits if a new data could be loaded into the flops, to be shifted out subsequently, the circuit becomes a new circuit (referred to as a loadable SR) which is an improved and more useful circuit.

Figure 2A:
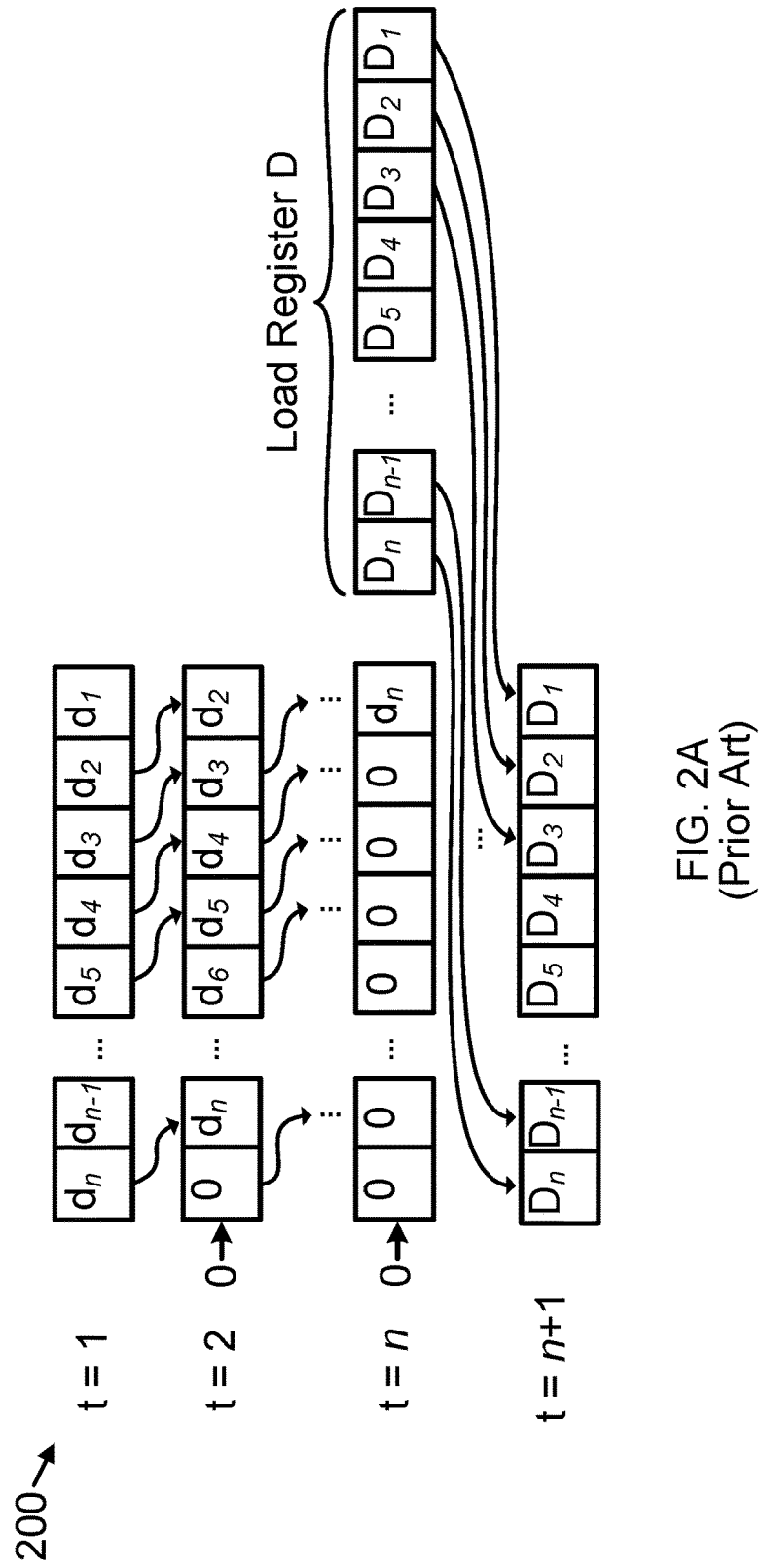
FIG. 2A illustrates an exemplary working of a loadable shift register as available in the prior-art.
Figure 2B:
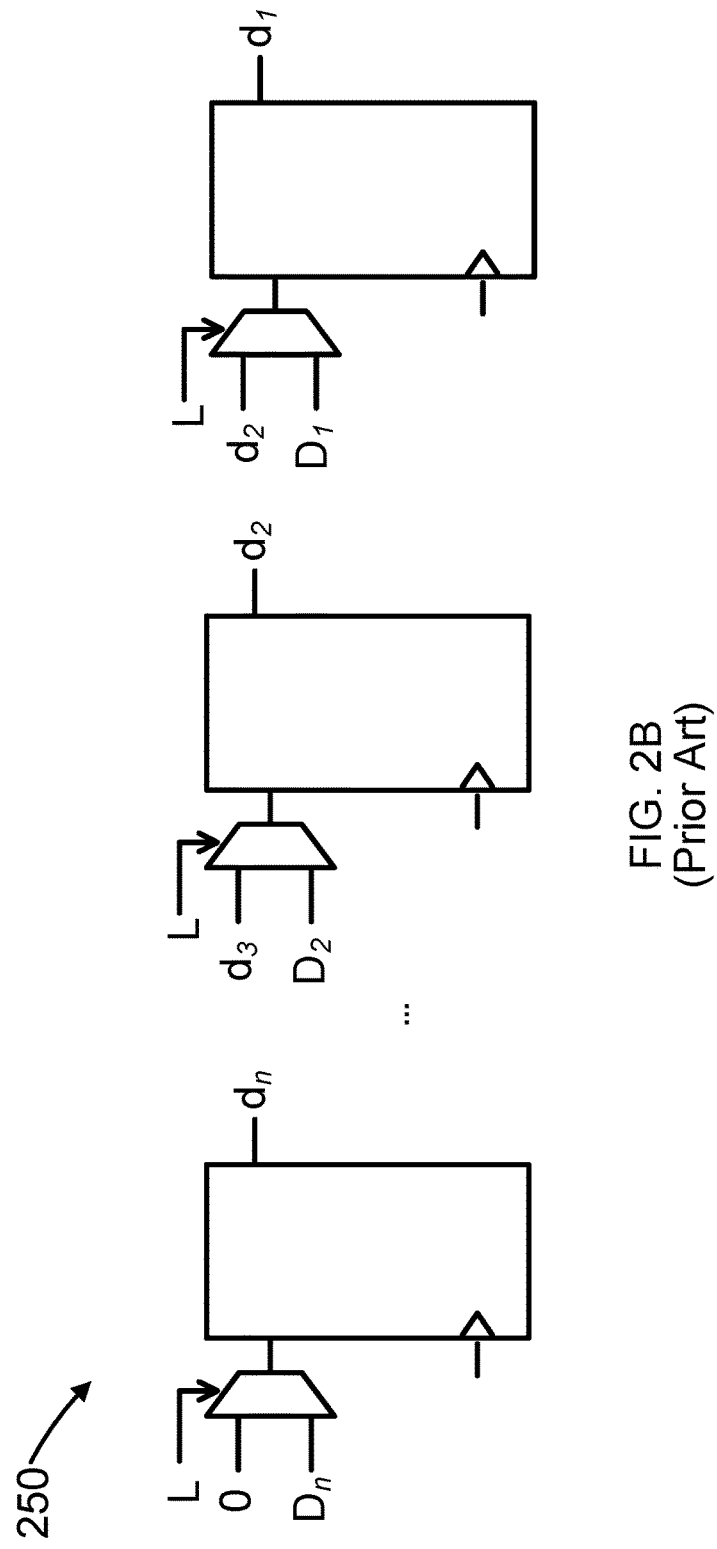
FIG. 2B illustrates an exemplary implementation of the exemplary loadable shift register as available in the prior-art.

Accordingly, FIG. 2A illustrates an exemplary working 200 of a loadable shift register as available in the prior-art. The loadable shift registers are same as shift registers illustrated in FIGS. 1A-B, however with an ability to load n-bit parallel data after n shifts. The loadable shift register works as a parallel to serial converter (a well known circuit). FIG. 2B illustrates an exemplary implementation 250 of the exemplary loadable shift register (SR) as available in the prior-art. To make a generic loadable SR, a signal "L" that loads a new value when high can be used/introduced/provided, and terminal count of shifts can be used to drive this signal, or it can come from some other pre-defined/pre-configured condition. Referring to FIG. 2B, in the implementation, L can be driven by the terminal count of a modulo-n counter. It may be observed that, when L=1, the value of D is loaded into the flops, whereas when L=0, the flops constitute a simple shift right register.

Figure 3A:
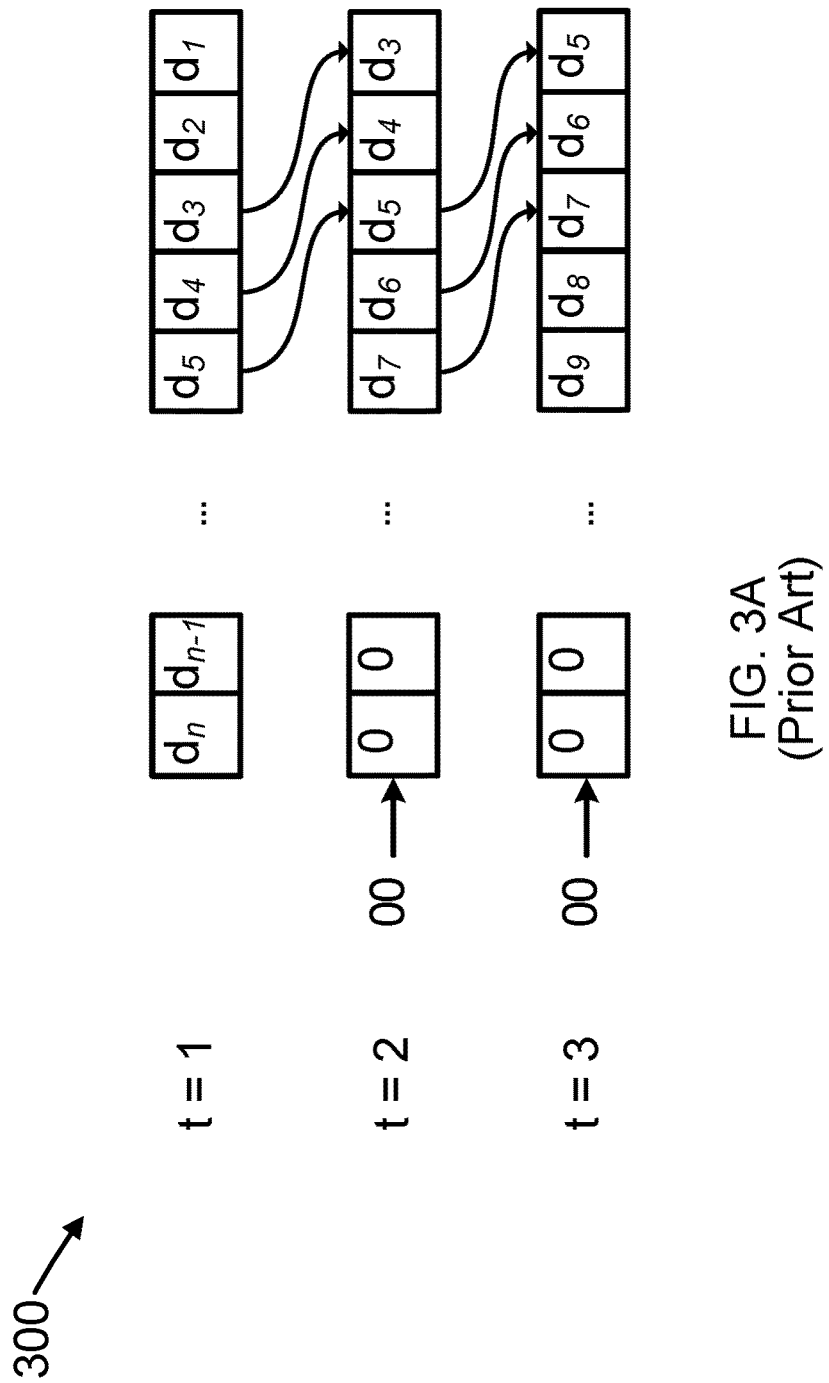
FIG. 3A illustrates an exemplary working of a programmable shift register as available in the prior-art.

FIG. 3A illustrates an exemplary working 300 of programmable shift register (pSR) as available in the prior-art which is an advanced SR when compared to the loadable shift register. The programmable shift register (SR) allows p-bit shifts of data at a time, so the data shifts right or left by p bits every clock (or at every successive time instant). In this case, "p" is received/retrieved from configuration register bits, and is thus programmable. In an example, as shown in FIG. 3A, the curved arrows point "p" bits to the right (here p=2). FIG. 3B illustrates an exemplary implementation 350 of the exemplary programmable shift register as available in the prior-art. In the implementation as shown in FIG. 3B, each bit needs an (n−1)-bit to 1-bit multiplexer (the select lines of which connect to p). If p∈{1, 2, 3 . . . n} is considered in an implementation, it means that, p=0 cannot be considered for this implementation. Such implementation is an un-optimized implementation.

Figure 4A:
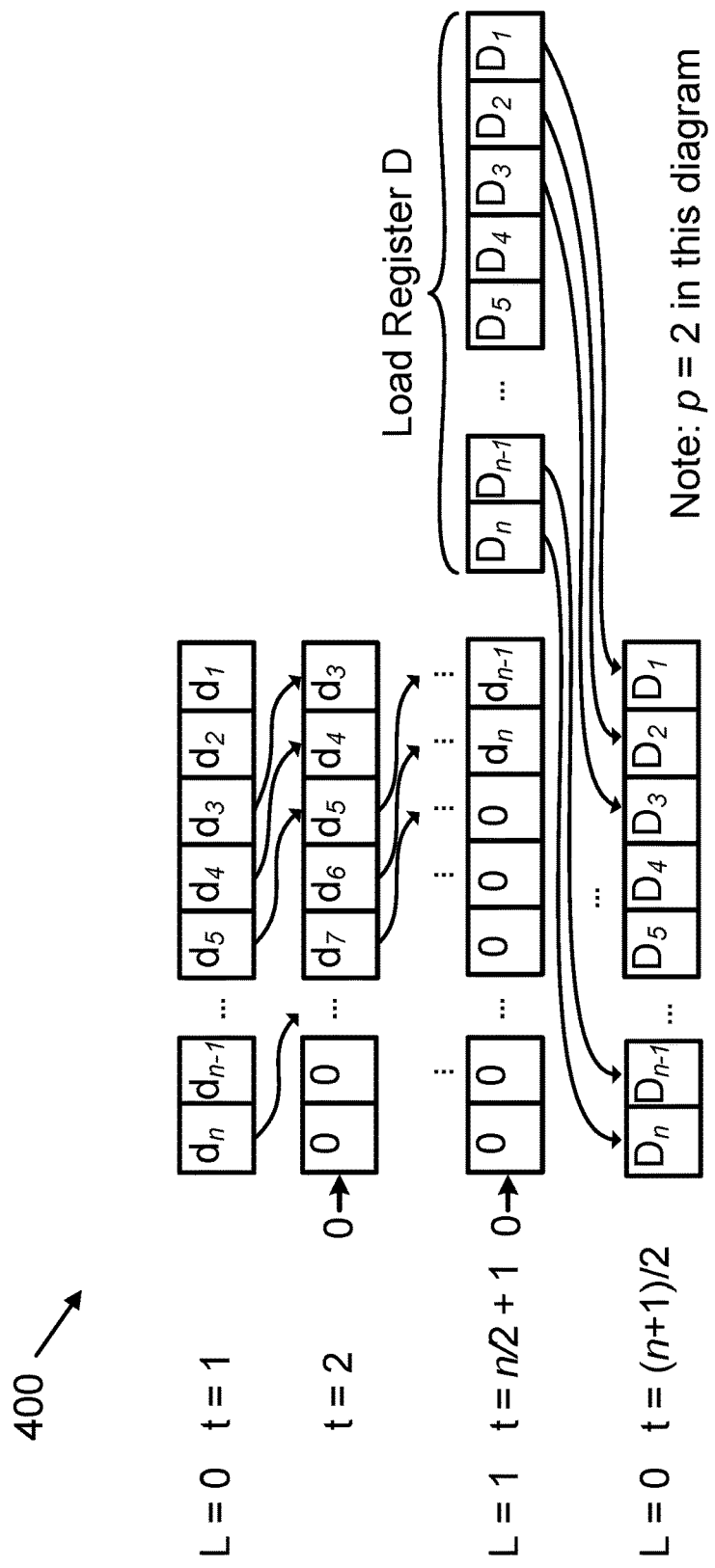
FIG. 4A illustrates an exemplary behavioral diagram of a loadable programmable shift register (pSR) as available in the prior-art.
Figure 4B:
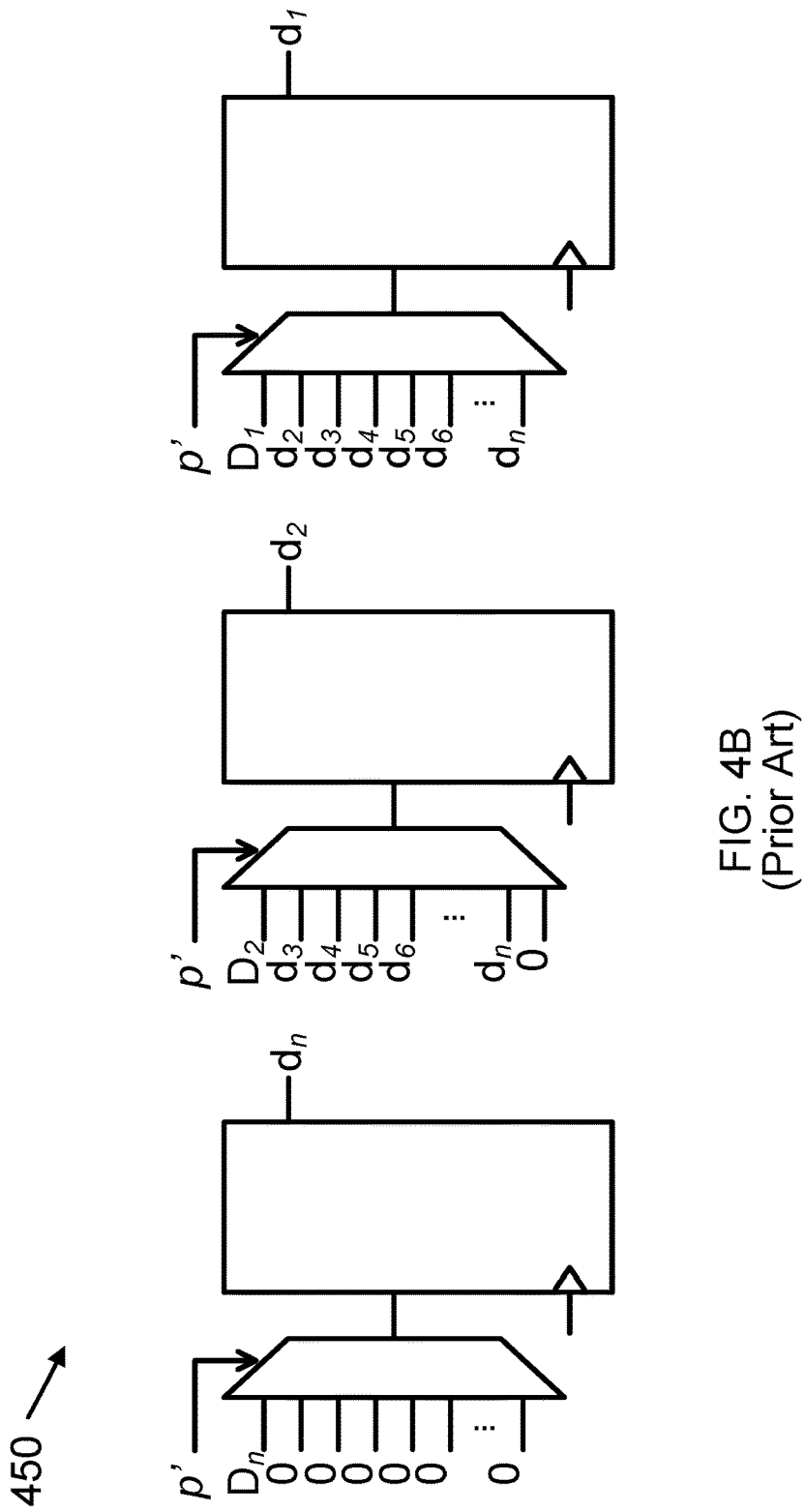
FIG. 4B illustrates an exemplary implementation of the loadable programmable shift register (pSR) as available in the prior-art.

FIG. 4A illustrates an exemplary behavioral diagram 400 of a loadable programmable shift register (pSR) as available in the prior-art which is an advanced SR when compared to the programmable shift register. The loadable programmable shift registers are same as a shift register, however with an ability to load n-bit parallel data when L=1. FIG. 4B illustrates an exemplary implementation 450 of the loadable programmable shift register (pSR) as available in the prior-art. Since the implementation of programmable shift register (pSR) is discussed in FIG. 3B, in order to implement the exemplary loadable programmable shift register, a 2:1 load multiplexer is merged with the (n−1):1 multiplexer which can be used for achieving programmable shift. In order to achieve this, there is a requirement of n: 1 multiplexer or even p=0 to imply loading can be used; i.e., if L=1, make p=0, and by using a derived signal p' to drive the mux select lines, given by p'=(p^~L) (where "^" is a Logical AND). It may be appreciated that, for this scenario, select lines are numbered from 0, unlike data which is numbered from 1.

Figure 4C:
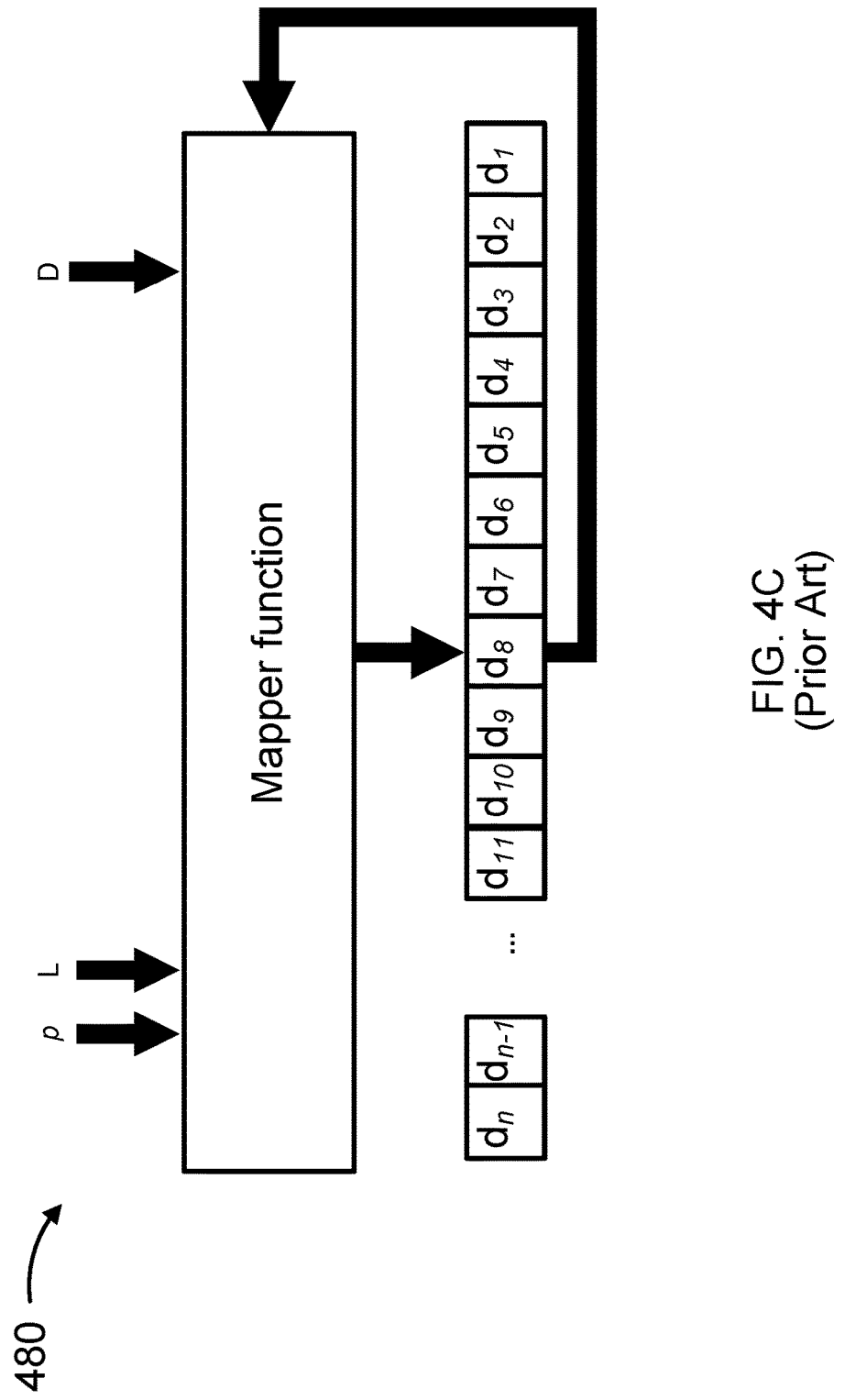
FIG. 4C illustrates an exemplary conceptual block diagram of the exemplary loadable programmable shift register as illustrated in FIGS. 4A-B with a mapper function as available in the prior-art.

FIG. 4C illustrates an exemplary conceptual block diagram 480 of the exemplary loadable programmable shift register as illustrated in FIGS. 4A-B with a mapper function as available in the prior-art. In an exemplary embodiment, the mapper function is utilized for re-mapping the re-interleaved data outputs into symbols and applying the re-mapped symbols iteratively to the mapper function (which operates as a decision filter).

As shown in FIG. 4C, the mapper function receives a data (D) from a load register along with a control signal for loading (L) of data, and a programmable shift value (p). In an exemplary embodiment, based on L and p, the data (D) is loaded in a register (not shown).

In the case of the Loadable pSR (as illustrated in FIGS. 4A-B and discussed above), the n:1 multiplexers and the logic for p' constitutes the mapper function. The output obtained from the mapper function may be referred to as a "load vector".

Accordingly, the load vector may be represented as below:

$$\text{load vector} = \begin{cases} D_i, & 1 \le i \le n, \\ d_{i+p}, & 1 \le i \le (n-p) \\ 0, & p > i \le n \end{cases} \begin{matrix} L=1 \\ L=0 \end{matrix}$$

It may be noted that from the above representation that, L selection requires at least 2:1 multiplexers, so if L=1, the mapper function equals to D, or if L=0, the mapper function depends on value of p (since p can have at most (n−1) values, this translates to a (n−1):1 multiplexer as discussed above). In an exemplary embodiment, this output can be further p combined by using an n: 1 multiplexer as before and generating p'.

Figure 5A:
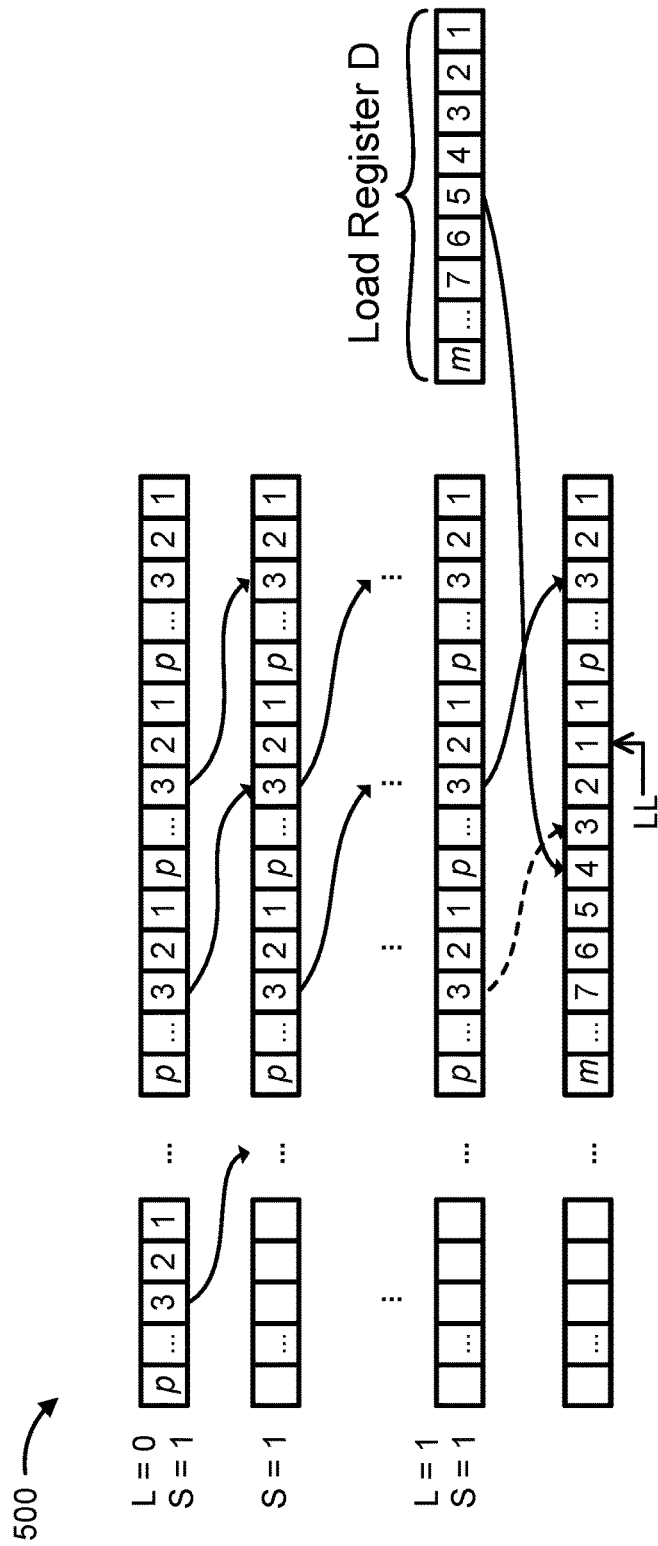
FIG. 5A illustrates an exemplary behavioral diagram of a proposed loadable programmable shift register with programmable load location (pSRL), in accordance with an embodiment of the present disclosure.

FIG. 5A illustrates an exemplary behavioral diagram of a proposed loadable programmable shift register with programmable load location (pSRL), which is an advanced SR when compared with the loadable programmable shift register (pSR). In an exemplary embodiment, the proposed pSRL is similar to a loadable pSR (as shown in FIGS. 4A-C), however the proposed pSRL accepts/receives an additional input Load Location (LL) that defines where the data "D" is to be loaded in the SR. Further, a signal "S" that controls shifting of the data is also accepted/received in the proposed pSRL. Accordingly, in an exemplary implementation, when S=1, a p-bit right shift is performed.

In an exemplary embodiment, a choice of "LL", as shown in FIG. 5A, overwrites data which can indicate that a load happens at whatever location LL points to when L=1, and a shift can happen concurrently with the load if S=1 at the same time. It may be appreciated that, even though this may not always be a useful scenario, however, such scenario may be useful in some cases and shall not restrict the scope of the present disclosure.

In an exemplary embodiment, a decision of load and shift in the pSRL can be decided based on a bit re-mapper (δ) 594 function. The bit re-mapper (δ) 594 function for pSRL can be evaluated as below:

if (L=1 and S=0) [LOAD OPERATION]

$$\delta_i = \begin{cases} D_{i-LL} & \text{if } LL \le i \le \min\{n, (LL+m)\} \\ d_i & \text{otherwise} \end{cases}$$

In this case, "$D_{i-LL}$" loads D from bit LL onwards till either m bits are loaded or space runs out, whereas, "$d_i$" holds state for other bits.

if (L=0 and S=1) [SHIFT OPERATION]

$$\delta_i = \begin{cases} d_{i+p} & \text{if } i < (n-p) \\ 0 & \text{otherwise} \end{cases}$$

In this case, "$d_{i+p}$" does a simple p-bit right shift for bits {p+1, p+2, . . . n}, whereas, "0" loads 0's into any leftover bits.

if (L=1 and S=1) [LOAD and SHIFT OPERATION]

$$\delta_i = \begin{cases} d_{i+p} & \text{if } i < LL \\ D_{i-LL} & \text{if } LL \le i \le \min\{n, (LL+m)\} \\ 0 & \text{otherwise} \end{cases}$$

In this case, "$d_{i+p}$" does a simple p-bit shift for bits {1, 2, 3, . . . (LL−1)}, which get the value of the bit p bits to their left, "$D_{i-LL}$" loads D from bit LL onwards till either m bits are loaded or space runs out, and "0" loads 0's into the leftover bits on the left.

if (L=0 and S=0) [NO OPERATION]

$$\delta_i = d_i$$

In this case, "$d_i$" holds state for all bits.

Where the function min is defined thus:

$$\min\{x_1, x_2\} = \begin{cases} x_1, & \text{if } x_1 < x_2 \\ x_2, & \text{otherwise} \end{cases}$$

Referring again to FIG. 5A i.e., exemplary behavioral diagram of a proposed loadable programmable shift register with programmable load location (pSRL) with the bit re-mapper (δ) 594, the load value for a few bits are considered:

Bit 1 could get the value of itself, one of (n−1) bits to its left, or only bit 1 of the load register, $D_1$—this is when LL=1. If LL>1, then loading happens to the left of bit 1 and $d_1$ stays uninvolved. This is a total of (n+1) values.

Similarly, bit 2 could get its own value, one of (n−2) bits to its left or only bits 1 and 2 of the load register ($D_1$ or $D_2$). It would get $D_1$ if LL=2, and it would get $D_2$ if LL=1. This is a total of (n+1) values.

Continuing, bit 3 could get its own value, one of (n−3) bits to its left or bits 1, 2 or 3 of the load register ($D_1$, $D_2$ or $D_3$). It would get $D_1$ if LL=3, $D_2$ if LL=2 and $D_3$ if LL=1. Once again, this is a total of (n+1) values.

Generically, bit r gets its own value, one of (n−r) bits to its left or one of r bits {1, 2, 3 . . . r} of the load register—$D_1$, $D_2$, $D_3$ . . . $D_r$. It gets $D_1$ if (LL=r), $D_2$ if LL=(r−1), $D_3$ if LL=(r−2) and so on. This is a total of (n+1) values. Thus, in general bit r gets the value of bit $D_{(r-LL+1)}$ if LL≤r. If LL>r, then bit r either may either get a shifted value or hold its previous value.

From above results it may be noted that, at most n (n+1):1 multiplexers are needed for the implementation. The multiplexer size starts reducing from the (n−m+1)$^{th}$ bit onwards because there are fewer bits on the left to choose from while shifting. The n$^{th}$ bit can only get its own value or one of m values from the load register, since it does not have bits on its left.

Figure 5B:
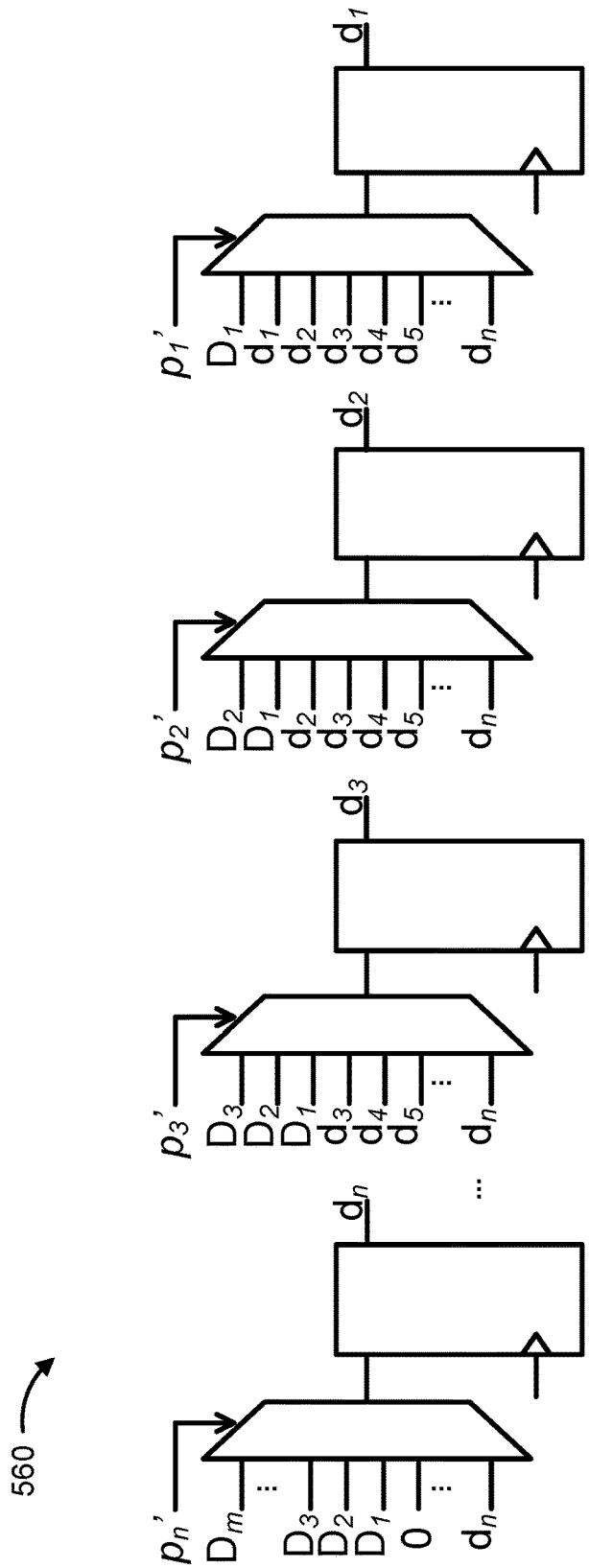
FIG. 5B illustrates an exemplary implementation of the proposed loadable programmable shift register with programmable load location (pSRL), in accordance with an embodiment of the present disclosure.

FIG. 5B illustrates an exemplary implementation of the proposed loadable programmable shift register with programmable load location (pSRL), in accordance with an embodiment of the present disclosure. In an embodiment, FIG. 5B illustrates the proposed loadable programmable shift register with an additional input that defines where data is loaded (pSRL).

It is to be appreciated that for the exemplary implementation purpose, $D_1$, $D_2$, $D_3$ . . . etc. are connected in the reverse order of $d_2$, $d_3$, $d_4$ . . . etc, which enables a simple way of realizing the expression (r−LL+1), since bit r will get the value of bit $D_{(r-LL+1)}$ from the load register while loading.

Figure 5C:
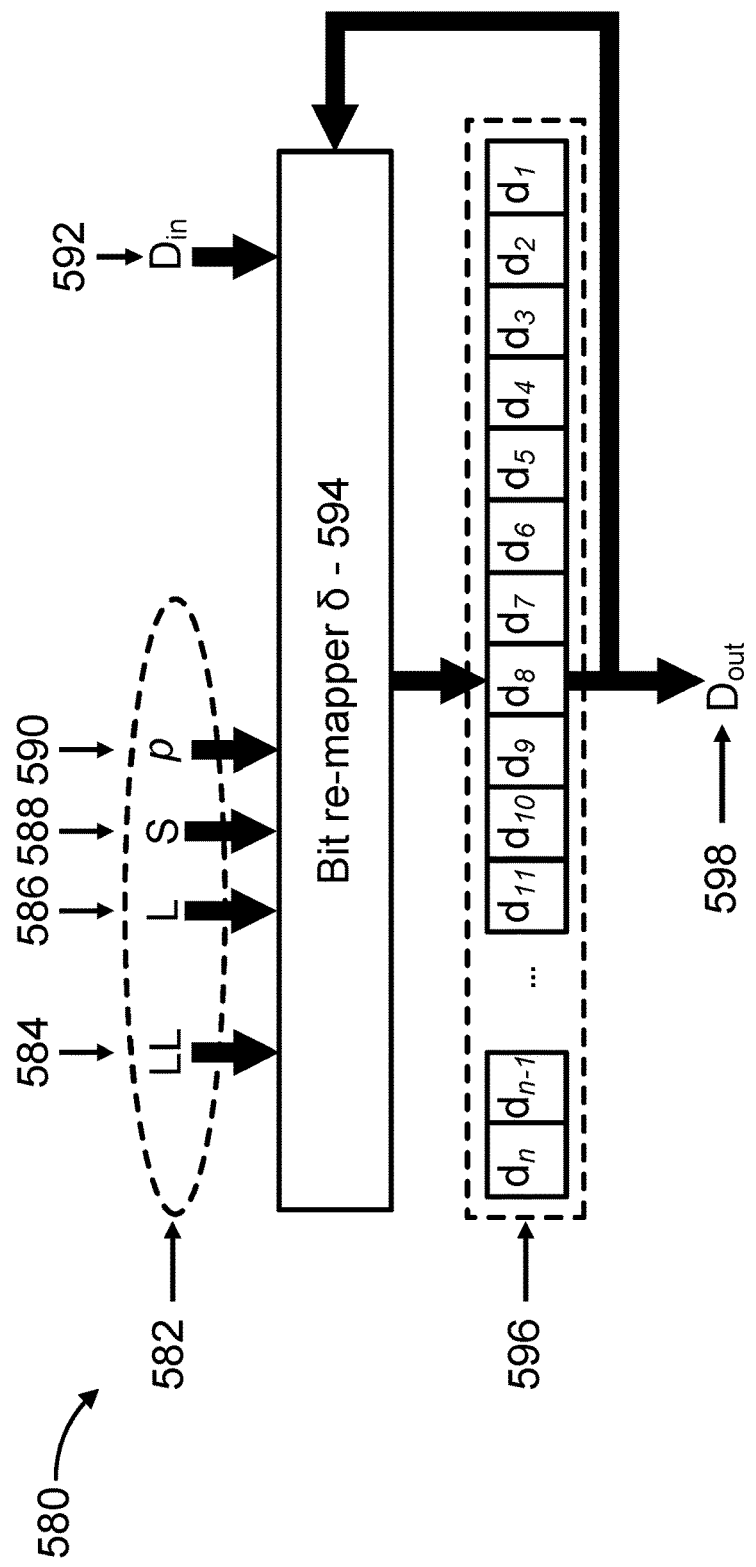
FIG. 5C illustrates an exemplary conceptual block diagram of the proposed loadable programmable shift register with programmable load location (pSRL) as illustrated in FIGS. 5A-B with a bit-remapper function ($\delta$), in accordance with an embodiment of the present disclosure.

In an exemplary embodiment, in an implementation, the proposed pSRL focuses on the way $p_i'$ is computed, wherein using the implementation as illustrated in FIG. 5C, for $p_i'$ generation for the pSRL:

$p_1'$ is realized by:
  if ((L = 1, S = 0) and (LL ≤ 1))
    $p_1'$ = (LL − 1)
  else if (S = 1)
    $p_1'$ = p + 1
  else
    $p_1'$ = 1 if (L = 1, S = 0) and (LL ≤ 3):

| LL | $p_1'$ | selects |
|---|---|---|
| 1 | 0 | $D_3$ |
| 2 | 1 | $D_2$ |
| 3 | 2 | $D_1$ | else if (S = 1)

| p | $p_1'$ | selects |
|---|---|---|
| 1 | 4 | $d_4$ |
| 2 | 5 | $d_5$ |
| 3 | 6 | $d_6$ |
| ... | ... | ... | else
  X   3   $d_3$ $p_2'$ is realized by:
  if ((L = 1, S = 0) and (LL ≤ 2))
    $p_2'$ = (LL − 1)
  else if (S = 1)
    $p_2'$ = p + 2
  else
    $p_2'$ = 2 if (L = 1, S = 0) and (LL ≤ 2):

| LL | $p_2'$ | selects |
|---|---|---|
| 1 | 0 | $D_2$ |
| 2 | 1 | $D_1$ | else if (S = 1)

| p | $p_2'$ | selects |
|---|---|---|
| 1 | 3 | $d_3$ |
| 2 | 4 | $d_4$ |
| 3 | 5 | $d_5$ |
| ... | ... | ... | else
  X   2   $d_2$ $p_3'$ is realized by:
  if ((L = 1, S = 0) and (LL ≤ 3))
    $p_3'$ = (LL − 1)
  else if (S = 1)
    $p_3'$ = p + 3
  else
    $p_3'$ = 3 if (L = 1, S = 0) and (LL ≤ 3):

| LL | $p_3'$ | selects |
|---|---|---|
| 1 | 0 | $D_3$ |
| 2 | 1 | $D_2$ |
| 3 | 2 | $D_1$ | else if (S = 1)

| p | $p_3'$ | selects |
|---|---|---|
| 1 | 4 | $d_4$ |
| 2 | 5 | $d_5$ |
| 3 | 6 | $d_6$ |
| ... | ... | ... | else
  X   3   $d_3$ $p_i'$ is realized by:
  if ((L = 1, S = 0) and (LL ≤ i))
    $p_i'$ = (LL − 1)
  else if (S = 1)
    $p_i'$ = p + i
  else
    $p_i'$ = i if (L = 1, S = 0) and (LL ≤ p):

| LL | $p_i'$ | selects |
|---|---|---|
| 1 | 0 | $D_p$ |
| 2 | 1 | $D_{p-1}$ |
| 3 | 2 | $D_{p-2}$ |
| ... | ... | ... |
| p | p−1 | $D_1$ | else if (S = 1)

| p | $p_i$ | selects |
|---|---|---|
| 1 | 1 + p | $d_{p+1}$ |
| 2 | 2 + p | $d_{p+2}$ |
| 3 | 3 + p | $d_{p+3}$ |
| ... | ... | ... | else
  X   p   $d_p$

Thus, it may be noted form the above that, the n (n+1): 1 multiplexers and $p_i'$ together defines the bit re-mapper function δ, which is a complete solution for a pSRL.

FIG. 5C illustrates an exemplary conceptual block diagram of the proposed loadable programmable shift register with programmable load location (pSRL) as illustrated in FIGS. 5A-B with a bit-remapper function (δ) 594, in accordance with an embodiment of the present disclosure. The proposed loadable programmable shift register includes with an additional input that defines where data is loaded (pSRL). Considering the above analysis representations and analysis, FIG. 5C illustrates the block diagram of pSRL. As shown in FIG. 5C, the bit-mapper function δ (also interchangeably referred to as bit-mapper δ 594) receives a data ($D_{in}$) from a load register having a data width (M) 592 along with at least one of control inputs 582 that control at least one of load location (LL) of data 584, loading (L) of data 584, shifting (S) of data 588, and a programmable shift value (p) 590. It may be noted from the above that, FIG. 5C provides a generalized programmable shift register with programmable load location which serves as a storage.

In an exemplary embodiment, the proposed loadable programmable shift register with programmable load location (pSRL) 580 is provided. The pSRL being configured to receive a programmable input LL 584 that defines where data D is to be loaded from the Load Register when L (Load Control Signal)=1.

In an exemplary embodiment, the pSR with programmable load location (pSRL) includes a bit-remapper δ 594 function that receives L (Load Control Signal) 586, S (Shift Control Signal) 588, LL (Load Location Control Signal) 584, and p (programmable shift value 590, and based on n (n+1):1 multiplexers and $p_i'$, outputs a load vector, wherein $p_i'=(LL-1)$ when ((L=1, S=0) and (LL≤i)), else if (S=1), $p_i'=p+i$, else $p_i'=i$.

In an exemplary embodiment, the pSRL receives the L (Load Control Signal), the S (Shift Control Signal), the LL (Load Location Control Signal), and the p (programmable shift value) from a control Finite State Machine (FSM) (not shown).

In an exemplary embodiment, if L=1 and S=0, $\delta_i=D_{i-LL}$ if LL≤i≤min (n, (LL+m)), else $\delta_i=d_i$. In another aspect, if L=0 and S=1, $\delta_i=d_{i+p}$ if i<(n−p), else $\delta_i=0$. In yet another aspect, if L=1 and S=1, $\delta_i=d_{i+p}$ if i<LL, else $\delta_i=D_{i-LL}$ if LL≤i≤min (n, (LL+m)), else $\delta_i=0$. In still another aspect, if L=0 and S=0, $\delta_i=d_i$.

Figure 6:
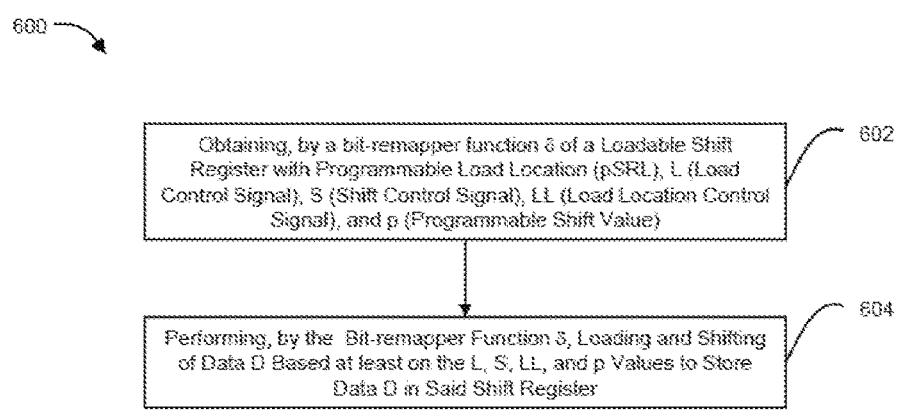
FIG. 6 illustrates an exemplary method performed by the proposed loadable programmable shift register with programmable load location (pSRL), in accordance with an embodiment of the present disclosure.

FIG. 6 illustrates an exemplary method performed by the proposed loadable programmable shift register with programmable load location (pSRL), in accordance with an embodiment of the present disclosure. In an embodiment, a method 600 for storing data D in shift register is provided. The method may be performed by utilizing a bit-remapper δ 594 function of a loadable Shift Register with programmable load location (pSRL) 580.

At step 602, L (Load Control Signal), S (Shift Control Signal), LL (Load Location Control Signal), and p (programmable shift value) is obtained.

At step 604, loading and shifting of data D is performed based at least on the L, S, LL, and p values to store data D in said shift register. In an exemplary embodiment, while loading and shifting of data D, the existing value of D is also fed back to bit-remapper δ 594 function of a loadable Shift Register with programmable load location (pSRL) 580.

In an exemplary embodiment, the bit-remapper function δ that receives L (Load Control Signal), S (Shift Control Signal), LL (Load Location Control Signal), and p (programmable shift value), and based on n (n+1):1 multiplexers and $p_i'$, outputs a load vector, wherein $p_i'=(LL-1)$ when ((L=1, S=0) and (LL≤i)), else if (S=1), $p_i'=p+i$, else $p_i'=i$.

Although the proposed system has been elaborated as above to include all the main modules, it is completely possible that actual implementations may include only a part of the proposed modules or a combination of those or a division of those into sub-modules in various combinations across multiple devices that can be operatively coupled with each other, including in the cloud. Further the modules can be configured in any sequence to achieve objectives elaborated. Also, it can be appreciated that proposed system can be configured in a computing device or across a plurality of computing devices operatively connected with each other, wherein the computing devices can be any of a computer, a laptop, a smartphone, an Internet enabled mobile device and the like. All such modifications and embodiments are completely within the scope of the present disclosure.

As used herein, and unless the context dictates otherwise, the term "coupled to" is intended to include both direct coupling (in which two elements that are coupled to each other or in contact each other) and indirect coupling (in which at least one additional element is located between the two elements). Therefore, the terms "coupled to" and "coupled with" are used synonymously. Within the context of this document terms "coupled to" and "coupled with" are also used euphemistically to mean "communicatively coupled with" over a network, where two or more devices are able to exchange data with each other over the network, possibly via one or more intermediary device.

Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

While some embodiments of the present disclosure have been illustrated and described, those are completely exemplary in nature. The disclosure is not limited to the embodiments as elaborated herein only and it would be apparent to those skilled in the art that numerous modifications besides those already described are possible without departing from the inventive concepts herein. All such modifications, changes, variations, substitutions, and equivalents are completely within the scope of the present disclosure. The inventive subject matter, therefore, is not to be restricted except in the spirit of the appended claims.

Technical Advantages of pSRL:
   i. Lowest possible latency: pSRL allows the reading out of an n-bit output word as soon as it becomes available. This is therefore, the lowest theoretically possible latency.
   ii. Low area: pSRL is implementable in n bits of storage, n (n+1):1 multiplexers and some gates to generate $p_i'$.
   iii. High performance: pSRL includes a highly optimized structural implementation and hence can operate at high speed.
   iv. Scalability: The pSRL is adapted to scale linearly making large values of n (size of pSRL) possible.

We claim:

1. A loadable programmable Shift Register (pSR) comprising:
   a cascade of flip flops, each flip flop in the cascade of flip flops having an input and an output; and
   a bit-remapper configured to receive data from a load register and load the data into the cascade of flip flops based on a plurality of control signals, the plurality of control signals comprising:
      a programmable input load location that defines a position in the cascade of flip flops where the data is to be loaded from the load register;
      a load control signal for controlling the loading of the data into the cascade of flip flops,
      a shift control signal for controlling a shifting of contents of the cascade of flip flops, and
      a programmable shift value indicating a number of bits to shift the contents of the cascade of flip flops responsive to the shift control signal.

2. The loadable pSR of claim 1, wherein the bit-remapper comprises a plurality of multiplexers, each multiplexer of the plurality of multiplexers corresponding to a respective flip flop of the cascade of flip flops and configured to output a respective element of a load vector, wherein the load vector is used to load the data into the cascade of flip flops.

3. The loadable pSR of claim 1, wherein the bit-remapper receives the plurality of control signals from at least one of a control Finite State Machine (FSM), a programmable logic device (PLD), or a software application.

4. The loadable pSR of claim 2, wherein responsive to the load control signal having a high value and the shift control signal having a low value, the load vector output by the plurality of multiplexers overwrites a portion of the contents of the cascade of flip flops, the portion of the contents including a bit stored in a flip flop corresponding to the load location.

5. The loadable pSR of claim 2, wherein responsive to the load control signal having a low value and the shift control signal having a high value, the load vector output by the plurality of multiplexers shifts a portion of the contents of the cascade of flip flops to a first portion of the cascade of flip flops by the number of bits indicated by the programmable shift value, and sets a second portion of the cascade of flip flops to zero.

6. The loadable pSR of claim 2, wherein responsive to the load control signal having a high value and the shift control signal having a high value, the load vector output by the plurality of multiplexers shifts a portion of the contents of the cascade of flip flops to a first portion of the cascade of flip flops by the number of bits indicated by the programmable shift value, and loads the data into a second portion of the cascade of flip flops, wherein the second portion of the cascade of flip flops is based on the load location.

7. The loadable pSR of claim 1, wherein an existing value stored in the cascade of flip flops having a same position as the position defined by the programmable input load location is overwritten in response to loading the data from the load register.

8. A method for storing data in a loadable programmable Shift Register (pSR), the method comprising:
  receiving, by a bit-remapper of the loadable pSR, data from a load register to be loaded into a cascade of flip flops;
  receiving, by the bit-remapper of the loadable pSR, a plurality of control signals comprising:
    a programmable input load location that defines a position in the cascade of flip flops where the data is to be loaded from the load register,
    a load control signal for controlling the loading of the data into the cascade of flip flops,
    a shift control signal for controlling a shifting of contents of the cascade of flip flops, and
    a programmable shift value indicating a number of bits to shift the contents of the cascade of flip flops responsive to the shift control signal; and
  performing, by the bit-remapper of the loadable pSR, loading of the data into the cascade of flip flops based at least on the plurality of control signals.

9. The method of claim 8, wherein the bit-remapper comprises a plurality of multiplexers, each multiplexer of the plurality of multiplexers corresponding to a respective flip flop of the cascade of flip flops, the method further comprising:
  outputting, by each multiplexer of the plurality of multiplexers, a respective element of a load vector; and
  loading, with the load vector, the data into the cascade of flip flops.

10. The method of claim 9, wherein performing loading of the data into the cascade of flip flops based at least on the plurality of control signals comprises:
  in response to the load control signal having a high value and the shift control signal having a low value, overwriting, by the load vector output by the plurality of multiplexers, a portion of the contents of the cascade of flip flops, the portion of the contents including a bit stored in a flip flop corresponding to the load location.

11. The method of claim 9, further comprising:
  in response to the load control signal having a low value and the shift control signal having a high value, shifting, by the load vector output by the plurality of multiplexers, a portion of the contents of the cascade of flip flops to a first portion of the cascade of flip flops by the number of bits indicated by the programmable shift value; and
  setting a second portion of the cascade of flip flops to zero.

12. The method of claim 9, wherein performing loading of the data into the cascade of flip flops based at least on the plurality of control signals comprises:
  in response to the load control signal having a high value and the shift control signal having a high value, shifting, by the load vector output by the plurality of multiplexers, a portion of the contents of the cascade of flip flops to a first portion of the cascade of flip flops by the number of bits indicated by the programmable shift value; and
  loading, by the load vector, the data into a second portion of the cascade of flip flops, wherein the second portion of the cascade of flip flops is based on the load location.

13. The method of claim 8, wherein the bit-remapper receives the plurality of control signals from at least one of a control Finite State Machine (FSM), a programmable logic device (PLD), or a software application.

14. The method of claim 8, further comprising:
  in response to loading the data from the load register, overwriting an existing value stored in the cascade of flip flops having a same position as the position defined by the programmable input load location.

15. The method of claim 8, further comprising:
  performing, by the bit-remapper of the loadable pSR, shifting of the contents stored in the cascade of flip flops based on the shift control signal and the programmable shift value.

* * * * *